United States Patent [19]

Toshiyuki et al.

[11] Patent Number: 4,812,755

[45] Date of Patent: Mar. 14, 1989

[54] BASE BOARD FOR TESTING INTEGRATED CIRCUITS

[75] Inventors: Nakaie Toshiyuki, Wakayama; Oonishi Tethuo, Naga, both of Japan

[73] Assignee: Hanwa Electronic Co., Ltd., Wakayama, Japan

[21] Appl. No.: 55,195

[22] Filed: May 28, 1987

[30] Foreign Application Priority Data

Jun. 5, 1986 [JP] Japan .................... 61-84733[U]

[51] Int. Cl.4 .................... G01R 31/26; G01R 1/04
[52] U.S. Cl. .................................. 324/158 F
[58] Field of Search .................... 324/158 F, 73 R

[56] References Cited

U.S. PATENT DOCUMENTS 3,988,049 10/1976 Williams et al. ............ 324/158 F X
4,677,375 6/1987 Nakaie et al. ................. 324/158 F

FOREIGN PATENT DOCUMENTS 24869 2/1982 Japan ..................... 324/158 R

Primary Examiner—Jerry Smith
Assistant Examiner—Stephen M. Baker
Attorney, Agent, or Firm—Burgess, Ryan & Wayne

[57] ABSTRACT

A plug board for testing integrated circuits includes a plurality of sockets for receiving the terminals of an integrated circuit to be tested, a plurality of contacting terminals arranged in an annular layout and electrically connected to the sockets, an annular grounding belt electrically connected to the contacting terminals and adapted to be grounded, and a drive system adapted to rotate the plug board about the center of the contacting terminals.

10 Claims, 7 Drawing Sheets

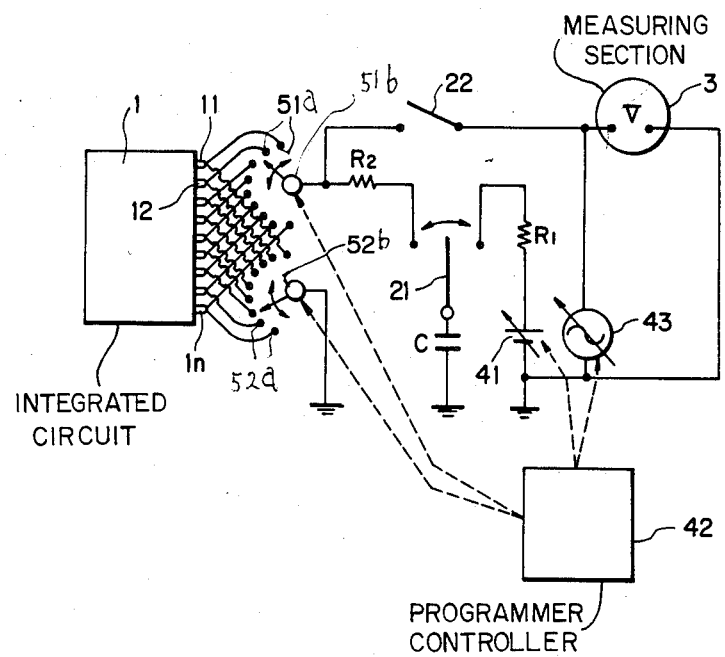

BASE BOARD FOR TESTING INTEGRATED CIRCUITS

BACKGROUND OF THE INVENTION

1. Field of the Invention

The present invention relates in general to a base board for testing integrated circuits and, in particular, to such a board of the type which is rotated by a drive system to to provide automatic switchover of integrated circuit terminals in the circuit characteristic and electrostatic breakdown testing.

2. Description of the Prior Art

Various methods and devices for testing integrated circuits for fault or diode characteristics have been developed and well known. In some of then, charged electricity in a capacitor is applied to the integrated circuit to be tested across selected pairs of terminals to check the effect of such charge application on the circuit.

In the prior art, testing requires the terminals of an integrated circuit to be selected in pair in a proper sequence and connected, one pair at a time, to a charging capacitor through a switch system that performs the terminal selection.

One conventional example comprises a manual switch system for selecting terminal pairs. However, where a large number of integrated circuits have to be tested, tremendous operator attention and cumbersome labor are demanded, with attendant inefficiency of operation.

In another example of the prior art, a relay circuit system is provided which comprises a number of lead wires. The wires are connected at their opposite end to the terminals of an integrated circuit to be tested. Means are provided to automatically connect the lead wires in pair to a capacitor which charges the terminals linked to the wires now connected. Because of the design requirements of such relay circuit systems, the lead wires are generally made long, with a resultant excessive increase in the distance between the charging capacitor and integrated circuit terminals to be tested. As a result, various problems arise.

Generally, the stray capacitance of the electric circuit depends on the length of the lead wires connected to the relay circuit due to floating capacitance present in the circuit between the lead wires and earthing. Floating capacitance is likely to invite inaccuracy in the measurement of electricity charged in a capacitor.

Thus, great demand has been placed on the development of a more efficient device for testing integrated circuits in which the terminals of an integrated circuit to be tested are selected in an automatic and easy manner for static charge application from a capacitor in the operating characteristic or electrostatic breakdown testing.

SUMMARY OF THE INVENTION

It is therefore a primary object of the present invention to provide an improved device for testing integrated circuits which comprises a rotatably disposed board carrying a number of sockets for connection to the terminals of an integrated circuit to be tested. The same number of contacting terminals as the sockets and an earthing ring are provided in the board in concentric arrangements. The board is driven by a drive system to rotate about the center of the sockets.

BRIEF EXPLANATION OF THE ACCOMPANYING DRAWINGS

FIG. 1 is a circuit diagram showing the principles of testing integrated circuits for electrostatic breakdown on which the basic subject of the present invention is based;

FIGS. 2(a) and 2(b) are side and top views of the conventional device which tests integrated circuits for operating characteristics, with the capability of simultaneously checking for electrostatic breakdown. The present invention is an improved version of said device;

FIG. 3(a) is a schematic view of the device for testing integrated circuit according to a preferred embodiment of the present invention, which includes grounding pins mounted in an earthing ring;

FIGS. 3(b), 3(c) and 3(d) are back, side and top views of a preferred embodiment of the plug board, which comprises grounding pins arranged in a gear wheel secured to the plug board;

FIG. 3(e) is a side cross-sectional view of the gear wheel depicted in FIG. 3(a) showing how the jumper is inserted into an earthing socket to establish electric connection between the earth line and intermediate pin;

FIGS. 3(f) and 3(g) are back and top views of a circular plug board with a toothed periphery constructed in accordance with another embodiment of the present invention;

FIGS. 4(a) and 4(b) are side views of an electrostatic charger and a testing part connected to the plug board with an earthed high-capacity device built according to a further embodiment of the present invention;

DETAILED DESCRIPTION OF THE INVENTION

Figure 2A:
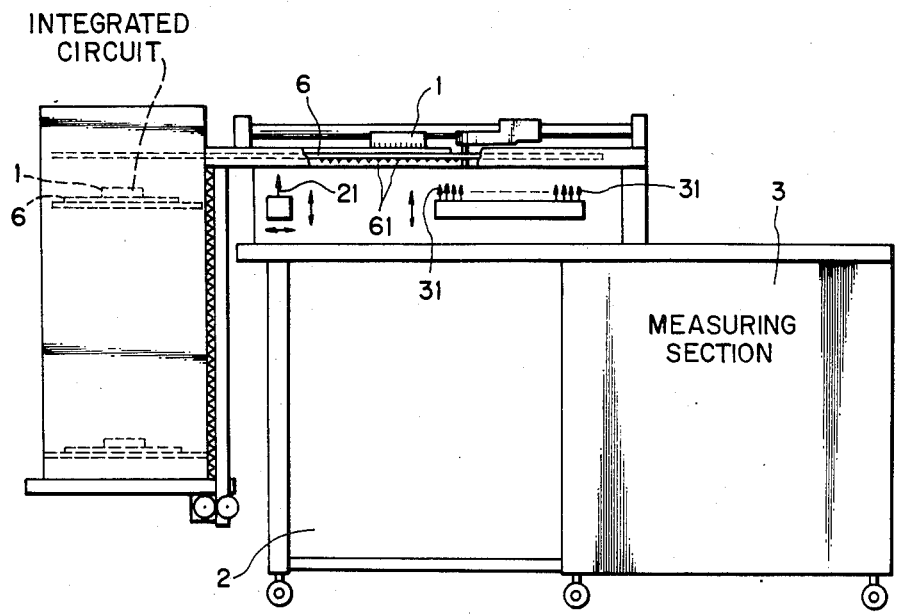

Prior to giving a detailed description of the preferred embodiments of the present invention, the principles of the electrostatic breakdown test for an integrated circuit will be briefly touched upon in order to provide a better understanding of the subject matter.

Referring first to FIG. 1, which presents in schematic form the basic structure of a typical electrostatic breakdown tester, a capacitor switch 21 is provided connected to a capacitor C, which is actuated to select between three positions; Discharging, Neutral and Charging. Turning the switch 21 to the Charging position (the right in the drawing) connects the capacitor C to a source of direct voltage 41 allowing the capacitor to be charged. Needless to say, the capacity fo the capacitor C is selected to meet test requirements. Also, a second switch 22 is provided connected to a source of alternating current 43 through a voltmeter 3 adapted to measure the currents from the source 43. When the switch 22 is closed, the current source 43 is connected to a first terminal selector 51. A second terminal connector 52 is provided connected to an earth line. The integrated circuit 1 to be tested is set on the tester in such a manner as to establish electric connection with both of the selectors 51 and 52.

Each of the first and second selectors 51 and 52 carries therein a plurality of pins 51a and 52a for electic connection through lead wires to the terminals 11 of the integrated circuit 1. Also, each of the selctors 51 and 52 is provided with a selector contact, 51b, 52b which is movably disposed for movement in both directions, as indicated by the arrow in the drawing, to select between the pins 51a, 52a. Thus, moving the selector contacts 51b, 52b selects a particular pair of terminals 11 of the integrated circuit 1 to be tested.

In operation, before and after the application of static charge to the integrated circuit through the selected pair of terminals 11 from the capacitor by turning the switch 21 to the Discharging position, the switch 22 is closed in order to read on the voltmeter the voltage across the terminal pair and readings are compared to determine the effect of the capacitor discharge on the terminals. In this way, an operating characteristic test is carried out with every terminal 11 in relation to every other terminal of an integrated circuit 1. When a given pair of terminals 11 results gives an abnormal change in the voltage readings, it might be signs of electrostatic breakdown caused between the terminals.

The tester may be provided with a programmer controller 42 which controls not only the sources 41 and 43 but also the selectors 51 and 52 providing automatic and controlled selection of the integrated circuit terminals 11 in predetermined sequence in operating characteristic tests.

The above tester, proposed by the same inventor as the present invention, is disclosed in U.S. patent application Ser. No. 745,265.

The invention disclosed in the above patent application is advantageous in some respects over those prior art electrostatic breakdown testers capable of testing the integrated circuit through single terminals alone to which a capacitor is discharged. In fact, however, it is likely that the application of static charge to an integrated circuit terminal causes a change in operating characteristic not only in that terminal but also in its circuit connected to other terminals. Therefore, to obtain reliability in electrostatic breakdown testing, it is necessary to measure the voltage between the terminal to which static charge is applied and every other terminal. The invention of the above application, while providing this feature of measuring inter-terminal voltage, has been proved to be cumbersome to handle and not very efficient in performance.

Figure 2B:
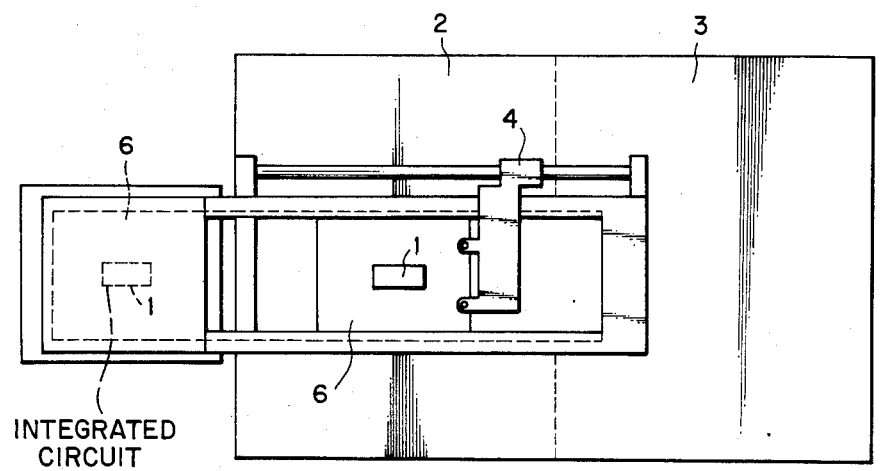

To solve the above difficulties, an improved tester has been proposed which is illustrated in FIGS. 2(a) and 2(b). The tester comprises a plug board 6 which carries therein a plurality of sockets 64, preferably in a number related to the terminals of an integrated circuit to be tested. The sockets 64 are adapted to receive therein integrated circuit terminals. Also, a plurality of contacting terminals 61 are provided in the board 6, preferably in the same number as the sockets 64 to which contacting terminals 61 are electrically connected. A static charger section 2 is provided which includes a capacitor C from which the integrated circuit is charged through selected terminals. A measuring section 3 is provided, preferably mounted adjacent to the charger section 2, and comprises a number of contact pins 31 for electrical contact with the contracting terminals 61 of the plug board 6. The measuring section 3 is designed to measure inter-terminal voltage through the contact pins 31 to check for operating characteristic and electrostatic breakdown. Also, the tester includes a conveyor section which carries plug board 6, along with integrated circuits 1 mounted thereon, to preset measuring position above the measuring section 3 where each integrated circuit is charged from the capacitor and checked. A serious problem with the tester is the need of transferring the plug board all the way to the charger section 2 and then to the measuring section 3 from its loading position where an integrated circuit is loaded for testing. Thus, the tester is necessarily built large in size, with a resultant increase in construction cost. Furthermore, some cumbersome is encounted in the application of electrostatic charge and in measuring interterminal voltage.

The above and other problems of the prior art are eliminated by the present invention comprising a plug board by which the application of electrostatic charge to an integrated circuit and checking it for operating characteristic and electrostatic breakdown are done in a more efficient and easier manner.

The basic components of the present invention consists of a plug board carrying therein a plurality of sockets to receive the terminals of an integrated circuit to be tested, a plurality of contacting terminals each electrically connected to one of the sockets and arranged in an annular layout, and an annular grounding belt for grounding, with a drive system to rotate the board about the center of the contacting terminals.

Preferred embodiments of the present invention will be described in full detail in conjunction with the accompanying drawings.

As stated above in connection with FIG. 1, testing an integrated circuit for inter-terminal operating characteristics and electrostatic breakdown comprises the application of static charge across a selected pair of contacting terminals 61 and selecting one of the affected terminals and a second contacting terminal in successive sequence for measurements.

As apparently shown in FIG. 1, one of the contacting terminals selected for measurement is always held connected to ground. Thus, it is possible to conduct a series of operating characteristic and electrostatic breakdown tests between the grounded contacting terminal and every other terminal in the integrated circuit by changing the other pair-forming terminals in sequence, and, after finishing with that particular terminal, keep on selecting every other contacting terminal for grounding so that the measurement i is completed for each contacting terminal in relation with all other terminals.

Figure 3:
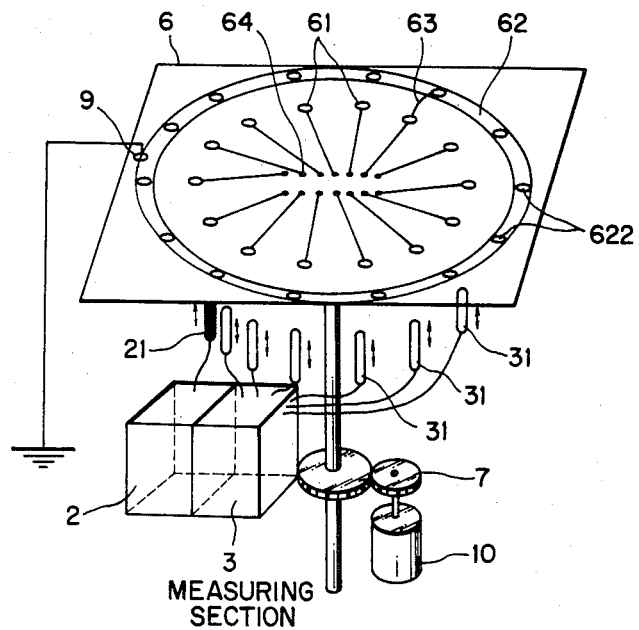

FIG. 3(a) illustrates a preferred embodiment of the present invention which includes a plug board capable of enhancing efficiency in the electrostatic breakdown test in conjunction with associated devices.

Referring to the figure, the plug board 6 carries therein a plurality of sockets 64 for the terminals of an integrated circuit 1 to be tested to plug in for electric connection therewith, a plurality of contacting terminals 61, preferably in the same number as the sockets 64, preferably arranged in an annular layout, to each of which one of the sockets is electrically connected, respectively, and an annular grounding belt 62 formed annularly externally of the terminals 61. The grounding belt 62 comprises a plurality of circularly arranged, equally spaced grounding pins 622, preferably located opposite the contacting terminals 61 for earth connection thereof; The grounding pins 622 are each connected to ground through the grounding belt 62. To ground a particular contacting terminals 61, a jumper 63 is interconnected between that terminal 61 and a corresponding grounding pin 622 located opposite the terminal. Since the plug board is rotated by a drive system 10 in operation, the earth connection at the belt 62 has to be designed such that the rotation of the board 6 would not adversely affect earth connection. In this particular embodiment, a brush 9 is provided, which is held above the board 6 in such a manner to provide sliding contact with the grounding belt 62.

A charging pin 21 is provided mounted at a proper location below the plug board 6 and connected to a charging section 2 comprising a capacitor, not shown, which discharges electrostatic charge into an integrated circuit to be tested. Also, the charging pin 21 is vertically movably disposed for movement between a lower neutral position and an upper operating position where the pin 21 is brought into electric connection with a particular contacting terminal 61 that is rotated into position by the plug board 6 through the drive system 10. A plurality of probing pins 31 are provided mounted below the plug board 6, at locations opposite the contacting terminals 61. Similar to the charging pin 21, the probing pins 31 are also vertically movably disposed for movement between a lower neutral position and an upper operating position where the probing pins are brought into electric connection with all other contacting terminals 61 except for the one now connected with the charging pin 21. The charging and measuring sections 2 and 3 in this embodiment are substantially similar to their counterparts described in connection with FIG. 1, so no additional description is made of them for brevity's sake.

In operation, with the above arrangement, when an integrated circuit is set on the plug board for testing, with all its terminals connected with the sockets 64, the charging section 3 is operated to allow the capacitor to discharge into the integrated circuit 1 through a selected contacting terminal 61, to which the charging pin 21 is connected, and a second contacting terminal, which is connected through a jumper 63 with the grounding belt 62 for grounding. With the probing pins 31 connected with all other contacting pins 61, checking the integrated circuit for operating characteristics and electrostatic breakdown is made for its terminal affected by electrostatic charge in relation not only to the earthed terminal but also to all others.

In addition, it is preferably that the measuring section 3 has a plurality of electric current sources and voltmeters, both not shown in the figures, substantially similar to FIG. 1 except that they are in the same number as the contacting terminals 61. To illustrate, the number of current sources, hence that of voltmeters, must be equal to nC2 or n(n−1)/2 where n =number of contacting terminals and C =binominal coefficient.

In testing according to the prior art of FIG. 1, the selectors 51 and 52 have to be operated to select a particular pair of contacting terminals 61 in the application of electrostatic charge and require checking, with constant turning the switches 21 and 22 off and on as the terminal pair is changed. A complete round of checking requires a number of such changeovers equal to nC2 or n(n−1) (refer to the equation above for the meaning of symbols) until all possible combinations of contacting terminal pairs are covered. By contract, as will be clear from the above description, the present invention can enhnance efficiency in inter-terminal operating characteristic and electrostatic breakdown checking, eliminating the need for successive changeover between all the terminals.

With the present invention, it is necessary to change the connection of the jumper 63 each time electrostatic charge is applied to a new selected contacting erminal 61. However, the number of operations to change earth connection in the complete test of integrated circuits is equal to no more than the total sum of contacting terminals.

Furthermore, the present invention is advantageous over the system depicted in FIGS. 2(a) and 2(b) in that it eliminates the large transfer system for moving plug boards without reducing the efficiency of the system.

Referring now to FIGS. 3(b), 3(c), 3(d) and 3(e), a gear wheel 62 is secured fixedly to the back of the plug board 6. A pinion 7 is provided which is drivingly connected to the drive system 10. Also, the pinion 7 is engaged in mesh with the gear wheel 62, so that the drive system 10 drives the plug board 6 through the pinion 7.

Means for providing earth connection in the plug board in conjunction with the drive system 10 will be described in accordance with a preferred embodiment. Referring to FIG. 3(e), a plurality of intermediate pins 621 are provided in the plug board 6, in the same number as the contacting terminals 61. As shown in FIG. 3(d), the intermediate pins 621 are preferably arranged in an annular layout at locations opposite the terminals 61.

In this particular embodiment, the gear wheel 62 affixed to the plug board 6 is adapted to provide earth. A throughhole is formed in each of the intermediate pins 621 for insertion of the jumper 63. The gear wheel 62 is of such size in the back of the plug board that the jumper 63, when properly inserted into any of the pins 621, establishes electric contact with the gear wheel 62 for grounding, as may best be shown in FIG. 3(e). In addition, the grounding pins 622 are situated at the lower part of the intermediate pins 621, instead of the grounding belt 62 in the previous embodiment.

FIGS. 3(f) and 3(g) show a further embodiment of the invention in which the plug board 6 is formed into a disk with a toothed periphery 62. A pinion 7 is provided engaged in mesh with the periphery 62 and is itself driven by the drive system 10 to rotate the plug board 6. The toothed periphery 62 is adapted to provide grounding in substantially the same manner as the gear wheel 62 of the preceding embodiment.

Figure 3B:
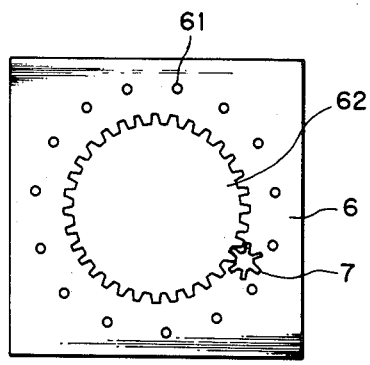

The embodiments described in connection with FIGS. 3(b) and 3(f) provides for grounding through the drive system of the plug board, eliminating the brush employed in the first embodiment.

Referring further to FIG. 3(g), in this embodiment, earth connection is provided by plugging in the jumper 63 across the selected contacting terminal 61 and its corresponding ground pin 622 located in the toothed periphery 62.

With the above embodiments, when a particular contacting terminal 61 is selected for testing, earth connection is made in sequence from one terminal to another. The process is repeated for every terminal 61 until all of the integrated circuit terminals are tested.

The test of an integrated circuit for operating characteristics and electrostatic breakdown may be conducted by a so-called device charge method in which a grounded high-capacity device such as a metal electrode is brought near to the integrated circuit to be tested so that electrostatic charge is applied to a selected terminal through a contacting terminal 61. Operating characteristic and electrostatic breakdown measurements are made with respect to that affected terminal.

This test method is based on observed phenomena that electrostatic charge through an earthed high-capacity device held near an integrated circuit terminal is likely to cause electrostatic breakdown in the routes connected with that terminal.

Figure 3C:
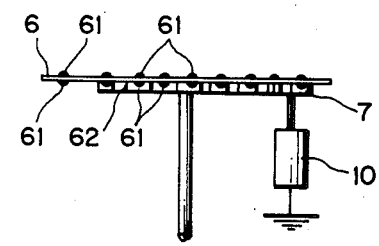
Figure 3:
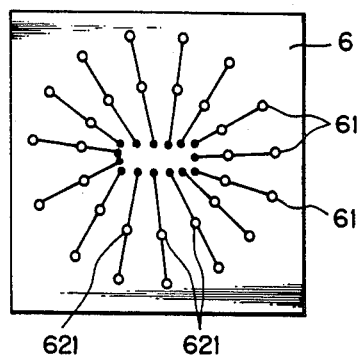
Figure 3:
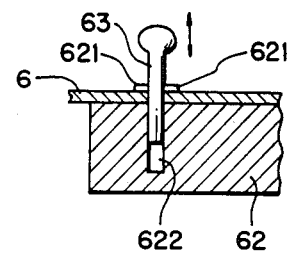
Figure 3:
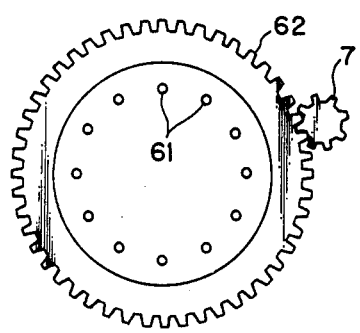
Figure 3:
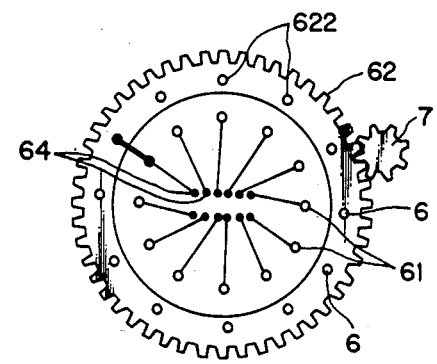
Figure 4A:
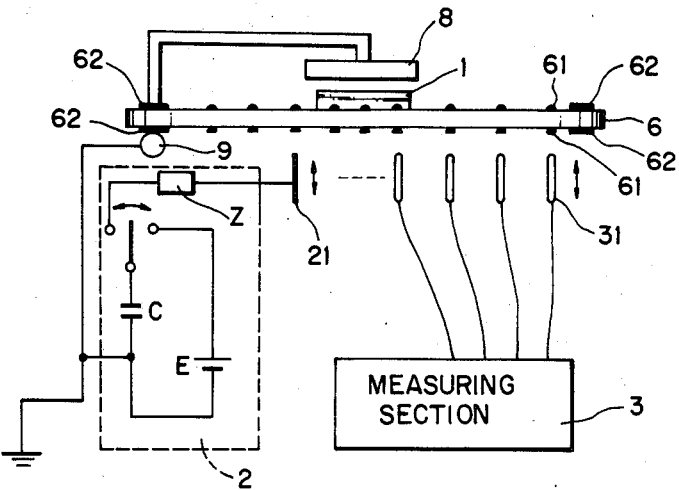

FIG. 4(a) illustrates a further embodiment of the present invention constructed based on the device charge method. A high-capacity device 8 is provided connected with an earthing section 62 formed in the periphery of the plug board 6. The earthing section 62 is in turn grounded through a brush 9, which is preferably disposed in such a manner as to slidingly contact with the board 6 when the latter is rotated. The earthing section 62 eliminates the grounding pins 622 of the embodiments described in connection with FIGS. 3(a), 3(b) and 3(c). Furthermore, this particular embodiment has the same arrangements for the sockets and contacting terminals 61 as the preceding embodiments shown in FIGS. 3(a), 3(b) and 3(c).

Referring further to FIG. 4(a), in operation, the plug board 6 is rotated by a drive system, not shown, to bring a particular contacting terminal 61 into position above a charging pin 21 which is then moved upward into electric contact with the contacting terminal 61. Then, the charging section 2 is operated to apply static charge to the contacting terminal 61. Since the static charge passes all the terminals of the integrated circuit 1 because of the metal electrode 8 connected to the plug board 6 through the earthing section 62, a complete round of operating characteristic and electrostatic breakdown testing for the integrated circuit can be done by lifting the vertically movable probing pins 31 into electrical contact with their respective contacting terminal 61 in sequence.

As with the preceding embodiments shown in FIGS. 3(a), 3(b) and 3(f), this particular embodiment features the ability of conducting the whole round of operating characteristic and electrostatic breakdown testing in a more efficient and easier manner, without bothering to change over the connections of each contacting terminal with others.

Figure 4B:
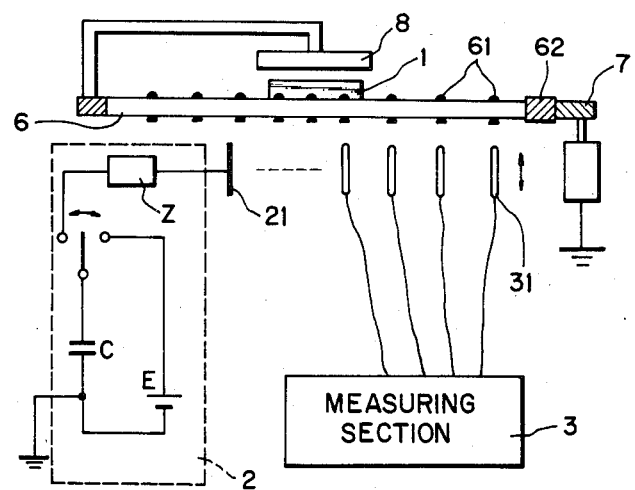

FIG. 4(b) shows a modification of the embodiment of FIG. 4(a), which comprises a gear 62 formed along the periphery of the disk shaped plug board 6. A pinion 7 is engaged in mesh with the gear 62 and is driven by a drive system to move the plug board 6. The plug board 6 is in substantially the same design as its counterpart of FIG. 3(b) and so eliminates the brush 9 of the embodiment described in connection with FIG. 4(a).

A high-capacity device 8 is provided installed in substantially the same manner as the embodiment of FIG. 4(a) and is rotated, while held in electric connection with the earthing section 62, with the plug board 6. However, in an alternative embodiment, the high-capacity device 8 may not be made to move with the plug board 6, providing it is held close enough to the integrated circuit 1 to be tested.

Figure 5:
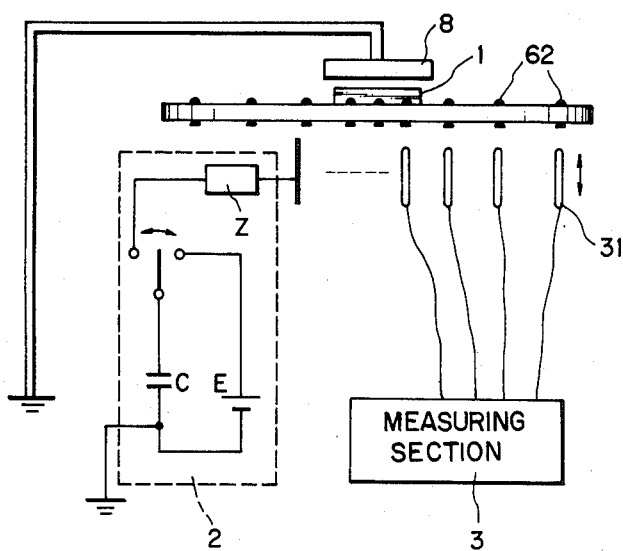
FIG. 5 is a side view of an electrostatic charger and a testing part connected to the plug board with a directly earthed high-capacity device constructed in accordance with an embodiment of the present invention.

FIG. 5 shows a further modification of the embodiment 4(a), which comprises a high-capacity device 8 that is directly grounded, instead of through an earthing section in the plug board 6. The high-capaicty device 8 is supported in close enough vicinity of the integrated circuit 1 to be tested to earth the static charge applied to the circuit. This modification elminates the earthing section 62 of the above embodiment shown in FIG. 4(a), with resultant simplification of construction.

Figure 6A:
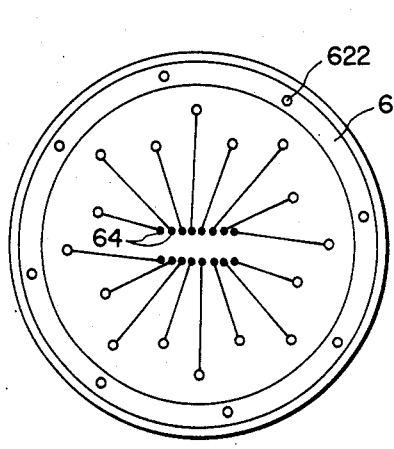
FIG. 6(a) is a top view of the plug board with contacting terminals arranged therein annularly with the rows of the connections according to an embodiment of the present invention.
Figure 6B:
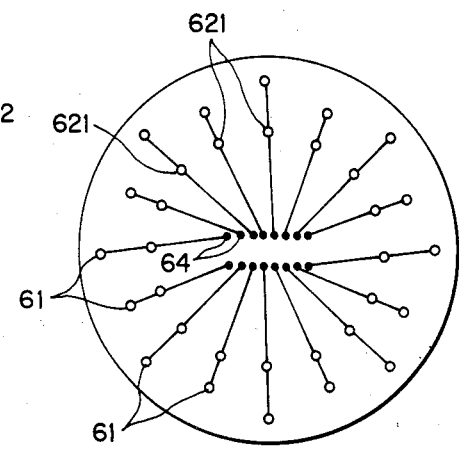
FIG. 6(b) is also a top view of a plug board similar to FIG. 6(b) according to a further embodiment of the present invention.

FIGS. 6(a) and 6(b) shows modified forms of the plug boards 6 described in connection with FIGS. 3(a), 3(b) and 3(c), which may conveniently be employed for testing integrated circuits with more terminals. Each of these modifications permits a large number of contacting terminals 61 to be arranged along multiple rows for applications where the number of terminals in a tested integrated circuit are too great for a plug board of the type shown in any of the preceding embodiments to have the corresponding number of contacting terminals in a single row.

Referring to FIG. 6(b), in particular, the plug board 6 is capable of carrying the numerous intermediate pins 621 in such an arrangement that keeps line with the contacting terminals 61 arrayed in the double rows.

Figure 6C:
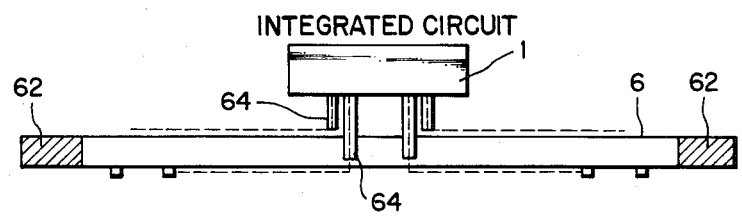
FIG. 6(c) is a side cross-sectional view of a multiple-layer plug board according to an embodiment of the present invention, in which the wiring for contacting terminals are depicted in dotted line.

When the number of the terminals of an integrated circuit to be tested is too great for a plug board of practical size to hold the numerous sockets even in multiple rows, the plug board design shown in FIG. 6(c) may be used in which the sockets are arranged in vertical layers so as to provide required spacing between the adjacent sockets.

Furthermore, the plug board of FIG. 6(c) may have the contacting terminals arranged in multiple rows and connected to the sockets placed in layers. The plug board 6 in FIG. 6(c) shows the sockets 64 in two layers.

From the above, it will be easily appreciated that the present invention can facilitate testing the integrated circuit for operating characteristics and electrostatic breakdown, with less floating capacity as a result of static charge applicaiton than conventional devices illustrated in FIGS. 2(a) and 2(b) owing to the far more simplified electromagnetic circuit of the charging section, providing increased accuracy of measurement.

What is claimed is:

1. A plug board for testing integrated circuits, comprising a plurality of sockets for receiving therein the terminals of an integrated circuit to be tested, a plurality of contacting terminals arranged in an annular layout and electrically connected to said sockets, an annular earthing belt electrically connected to said contacting terminals and adapted for grounding, and a drive system adapted to rotate said plug board about the center of said contacting terminals.

2. The plug board as set forth in claim 1, wherein said contacting terminals are arranged in multiple rows.

3. The plug board as set forth in claim 1, wherein said earthing belt provides grounding connection through a brush installed in sliding contact with said plug board.

4. The plug board as set forth in claim 3, wherein a high-capacity device is provided mounted at a location near a testing position in said plug board where an integrated circuit to be tested is set so that the application of static charge through a selected one of said contacting terminals results in the charge going through all the terminals of said integrated circuit to ground via said device that is electrically connected with said earthing belt.

5. The plug board as set forth in claim 3, wherein said earthing belt is provided with a plurality of grounding pins for earth connection with said contacting terminals through a jumper.

6. The plug board as set forth in claim 1, wherein a gear wheel is secured fixedly to said plug board and engaged in mesh with a pinion drivingly connected to said drive system, said drive system being operated to rotate said plug board through said pinion, said gear wheel being adapted to provide earth connection for said contacting terminals.

7. The plug board as set forth in claim 6, wherein said plug board is provided along its periphery with a toothed portion for engagement with said pinion in such a manner that said drive system rotates said plug board, said toothed portion being adapted to provide earth connection for said contacting terminals.

8. The plug board as set forth in claim 6, where a high-capacity device is connected to said gear wheel and mounted at a location near a testing position in said plug board where an integrated circuit to be tested is set so that static charge applied to a selected one of said contacting terminals goes through all the integrated circuit terminals to ground via said device.

9. The plug board as set forth in claim 6, wherein said gear wheel is provided with a plurality of grounding pins for earth connection with said contacting terminals.

10. The plug board as set forth in claim 5 or 9, wherein a plurality of intermediate pins are provided in said plug board along a diameter between said grounding pins and said contacting terminals for earth connection therebetween.

* * * * *